United States Patent
Cooper et al.

(10) Patent No.: US 10,446,389 B2
(45) Date of Patent: Oct. 15, 2019

(54) FORMULATIONS FOR THE REMOVAL OF PARTICLES GENERATED BY CERIUM-CONTAINING SOLUTIONS

(71) Applicant: Entegris, Inc., Billerica, MA (US)

(72) Inventors: Emanuel I. Cooper, Scarsdale, NY (US); Jeffery A. Barnes, Bethlehem, CT (US)

(73) Assignee: ENTEGRIS, INC., Billerica, MA (US)

( * ) Notice: Subject to any disclaimer, the term of this patent is extended or adjusted under 35 U.S.C. 154(b) by 61 days.

(21) Appl. No.: 15/669,238

(22) Filed: Aug. 4, 2017

(65) Prior Publication Data

US 2017/0338104 A1 Nov. 23, 2017

Related U.S. Application Data

(63) Continuation of application No. 13/978,825, filed as application No. PCT/US2012/021069 on Jan. 12, 2012, now abandoned.

(60) Provisional application No. 61/432,370, filed on Jan. 13, 2011.

(51) Int. Cl.
*H01L 21/311* (2006.01)
*H01L 21/02* (2006.01)

(52) U.S. Cl.
CPC .. *H01L 21/02076* (2013.01); *H01L 21/02057* (2013.01); *H01L 21/31133* (2013.01)

(58) Field of Classification Search
CPC ..................... C11D 11/0047; H01L 21/32134
USPC ........................................................ 510/175
See application file for complete search history.

(56) References Cited

U.S. PATENT DOCUMENTS

| | | | |
|---|---|---|---|
| 4,976,810 A | 12/1990 | Masuda et al. | |
| 5,545,576 A | 8/1996 | Matsumoto et al. | |
| 5,726,477 A | 3/1998 | Williams et al. | |
| 5,972,124 A | 10/1999 | Sethuraman et al. | |
| 5,972,134 A | 10/1999 | Buschsieweke et al. | |
| 5,985,522 A | 11/1999 | Iwasa et al. | |
| 5,993,685 A | 11/1999 | Currie et al. | |
| 6,156,661 A * | 12/2000 | Small | B08B 3/08 134/40 |
| 6,162,565 A | 12/2000 | Chao et al. | |
| 6,194,366 B1 | 2/2001 | Naghshineh et al. | |
| 6,451,687 B1 | 9/2002 | Liu et al. | |
| 6,492,308 B1 | 12/2002 | Naghshineh et al. | |
| 6,492,310 B2 | 12/2002 | Wojtczak et al. | |
| 6,568,995 B1 * | 5/2003 | Mitani | C11D 3/0042 451/36 |
| 6,692,546 B2 | 2/2004 | Ma et al. | |
| 6,698,619 B2 | 3/2004 | Wertenberger | |
| 6,699,402 B2 | 3/2004 | Russell et al. | |
| 6,723,691 B2 | 4/2004 | Naghshineh et al. | |
| 6,758,912 B2 | 7/2004 | Chao et al. | |
| 6,800,218 B2 | 10/2004 | Ma et al. | |
| 7,029,373 B2 | 4/2006 | Ma et al. | |
| 7,188,644 B2 | 3/2007 | Kelly et al. | |
| 7,300,601 B2 | 11/2007 | Liu et al. | |
| 7,368,388 B2 | 5/2008 | Small et al. | |
| 7,384,870 B2 | 6/2008 | Saito et al. | |
| 7,402,530 B2 | 7/2008 | Suzuki et al. | |
| 7,736,405 B2 | 6/2010 | Darsillo et al. | |
| 7,922,824 B2 | 4/2011 | Minsek et al. | |
| 7,923,423 B2 | 4/2011 | Walker et al. | |
| 8,026,200 B2 | 9/2011 | Cooper et al. | |
| 8,304,344 B2 | 11/2012 | Boggs et al. | |
| 8,367,555 B2 | 2/2013 | Afzali-Ardakani et al. | |
| 2001/0024852 A1 | 9/2001 | Aoki et al. | |
| 2002/0016060 A1 * | 2/2002 | Matsuzawa | C01F 17/0043 438/633 |
| 2002/0077259 A1 | 6/2002 | Skee | |
| 2002/0090811 A1 | 7/2002 | Kim et al. | |
| 2002/0157199 A1 * | 10/2002 | Piltingsrud | C03C 23/0075 15/77 |
| 2003/0003754 A1 | 1/2003 | Yokoi et al. | |
| 2003/0051740 A1 | 3/2003 | Chao et al. | |
| 2003/0073501 A1 | 4/2003 | Small et al. | |
| 2003/0186175 A1 | 10/2003 | Ikemoto et al. | |
| 2003/0232173 A1 | 12/2003 | Saito et al. | |
| 2004/0203320 A1 | 10/2004 | Hosaka et al. | |
| 2004/0211753 A1 | 10/2004 | Shimizu et al. | |
| 2006/0160014 A1 | 7/2006 | Nagahara et al. | |
| 2008/0076688 A1 | 3/2008 | Barnes et al. | |
| 2008/0248651 A1 | 10/2008 | Suzuki et al. | |
| 2009/0130849 A1 | 5/2009 | Lee | |
| 2009/0131295 A1 | 5/2009 | Cui | |

(Continued)

FOREIGN PATENT DOCUMENTS

| | | |
|---|---|---|
| JP | 20020064101 A | 2/2002 |
| JP | 2006017843 A | 1/2006 |

(Continued)

OTHER PUBLICATIONS

"Hydrogen Peroxide," retrieved from the Internet URL: https://web.archive.org/web/20040414162858/https://en.wikipedia.org/wiki/Hydrogen_peroxide on Nov. 29, 2018, pp. 22, last edited on Sep. 16, 2018.

(Continued)

*Primary Examiner* — Gregory E Webb

(74) *Attorney, Agent, or Firm* — Entegris, Inc.

(57) ABSTRACT

Compositions and methods for removing lanthanoid-containing solids and/or species from the surface of a microelectronic device or microelectronic device fabrication hardware. Preferably, the lanthanoid-containing solids and/or species comprise cerium. The composition is preferably substantially devoid of fluoride ions.

15 Claims, No Drawings

(56) References Cited

U.S. PATENT DOCUMENTS

| | | |
|---|---|---|
| 2009/0133716 A1 | 5/2009 | Lee |
| 2009/0212021 A1 | 8/2009 | Bernhard et al. |
| 2009/0215269 A1 | 8/2009 | Boggs et al. |
| 2009/0239777 A1 | 9/2009 | Angst et al. |
| 2009/0298289 A1 | 12/2009 | Jeong et al. |
| 2010/0087065 A1 | 4/2010 | Boggs et al. |
| 2010/0261632 A1 | 10/2010 | Korzenski et al. |
| 2011/0039747 A1 | 2/2011 | Zdhou et al. |
| 2011/0140181 A1 | 6/2011 | Afzali-Ardakani et al. |
| 2011/0221077 A1 | 9/2011 | Ishibashi et al. |
| 2012/0065116 A1* | 3/2012 | Miyashita ............... C11D 3/042 510/175 |
| 2012/0065118 A1 | 3/2012 | Miyashita et al. |
| 2012/0256122 A1 | 10/2012 | Sato et al. |
| 2013/0270217 A1 | 10/2013 | Yoshida et al. |
| 2014/0318584 A1* | 10/2014 | Cooper ............. H01L 21/02057 134/42 |
| 2016/0122696 A1 | 5/2016 | Liu et al. |

FOREIGN PATENT DOCUMENTS

| | | |
|---|---|---|
| WO | 2008/141206 A2 | 11/2008 |
| WO | 2010086745 A1 | 8/2010 |
| WO | 2010/134185 A1 | 11/2010 |
| WO | 2010134185 A1 | 11/2010 |
| WO | 2011072188 A2 | 6/2011 |
| WO | 2012009639 A2 | 1/2012 |
| WO | 2012051380 A2 | 1/2012 |
| WO | 2012048079 A2 | 12/2012 |
| WO | 2014186538 A1 | 11/2014 |

OTHER PUBLICATIONS

International Search Report, dated Aug. 31, 2012.
Hughes, John E.Q., U.S. Appl. No. 60/916,966, filed May 9, 2007, pp. 1-40.

* cited by examiner

FORMULATIONS FOR THE REMOVAL OF PARTICLES GENERATED BY CERIUM-CONTAINING SOLUTIONS

CROSS REFERENCE TO RELATED APPLICATION

This application is a continuation of U.S. application Ser. No. 13/978,825, filed on Sep. 23, 2013, which claims the benefit of PCT/US2012/021069, filed Jan. 12, 2012, which in turn claims priority to U.S. Provisional Patent Application having U.S. Ser. No. 61/432,370, filed Jan. 13, 2011, all of which are incorporated herein by reference in their entireties for all purposes.

FIELD

The present invention relates to compositions and methods for removing lanthanoid-containing solids and/or species from the surface of a microelectronic device or microelectronic device fabrication hardware. Preferably, the compositions and methods remove cerium-containing solids and/or species from surfaces.

DESCRIPTION OF THE RELATED ART

Resist, including photoresist, is a radiation sensitive (e.g., light radiation sensitive) material used to form a patterned layer on a substrate (e.g., a semiconductor wafer) during semiconductor device fabrication. After exposing a portion of a resist coated substrate to radiation, either the exposed portion of the resist (for positive resist), or the unexposed portion of the resist (for negative resist) is removed to reveal the underlying surface of the substrate, leaving the rest of the surface of the substrate coated and protected by resist. Resist may be more generally referred to as a masking material. Other fabrication processes such as ion-implanting, etching, or depositing may be performed on the uncovered surface of the substrate and the remaining resist. After performing the other fabrication processes, the remaining resist is removed in a strip operation.

In ion-implantation, dopant ions (e.g., ions of boron, boron difluoride, arsenic, indium, gallium, phosphorous, germanium, antimony, xenon or bismuth) are accelerated toward a substrate to be implanted. The ions are implanted in the exposed regions of the substrate as well as in the remaining resist. Ion-implantation may be used, for example, to form implanted regions in the substrate such as the channel region and source and drain regions of transistors. Ion-implantation may also be used to form lightly doped drain and double diffused drain regions. However, ions implanted in the resist may deplete hydrogen from the surface of the resist causing the resist to form an outer layer or crust, which may be a carbonized layer that is harder than the underlying portion of the resist layer (i.e., the bulk portion of the resist layer). The outer layer and the bulk portion have different thermal expansion rates and react to stripping processes at different rates. High dose ion-implanted resist may cause severe hardening or crusting of the resist resulting in relatively large differences between the outer layer and bulk portion in, for example, differences in thermal expansion rates, solubilities and other chemical and physical characteristics.

The present inventors previously discovered that a composition comprising at least one salt or coordination complex of the element cerium, e.g., ceric ammonium nitrate (CAN), can effectively remove masking material, e.g., high dose ion-implanted resist, from a substrate. Advantageously, this composition and method operates at a lower acidity and temperature than the compositions and methods known in the prior art and as such, causes less damage to TiN and other metal gate materials present on the substrate. Disadvantageously, the reduction of cerium (IV) compounds and sometimes the dilution of the solution with water may result in precipitation of hydrolyzed solids such as $Ce(NO_3)_x(OH)_y$, where $x+y \leq 4$, especially at elevated temperatures typically used for HDIS. In addition, hydrolyzed cerium species may adsorb to films present on the substrate being treated.

It is an object of the present invention to substantially remove the hydrolyzed solids that may precipitate or adsorb on surfaces during the use of lanthanoid-containing compositions.

SUMMARY OF THE INVENTION

The present invention relates to compositions and methods for removing lanthanoid-containing solids and/or species from the surface of a microelectronic device or microelectronic device fabrication hardware. Preferably, the compositions and methods remove cerium-containing solids and/or species from surfaces.

Other aspects, features and advantages of the invention will be more fully apparent from the ensuing disclosure and appended claims.

DETAILED DESCRIPTION, AND PREFERRED EMBODIMENTS THEREOF

The present invention relates to compositions and methods for removing lanthanoid-containing solids and/or species from the surface of a microelectronic device or microelectronic device fabrication hardware. Preferably, the compositions and methods remove cerium-containing solids and/or species from surfaces. The composition is preferably substantially devoid of fluoride ions.

In one aspect, a method of removing lanthanoid-containing solids and/or species from the surface of a microelectronic device or microfabrication hardware is described, said method comprising contacting the surface with a composition that substantially dissolves the lanthanoid-containing solids and/or species present on the surface. Preferably, the composition comprises at least one acid, at least one reducing agent, and water, wherein the composition is substantially devoid of fluoride ions.

For ease of reference, "microelectronic device" corresponds to semiconductor substrates, flat panel displays, phase change memory devices, solar panels and other products including solar cell devices, photovoltaics, and microelectromechanical systems (MEMS), manufactured for use in microelectronic, integrated circuit, energy collection, or computer chip applications. It is to be understood that the terms "microelectronic device," "microelectronic substrate" and "microelectronic device structure" are not meant to be limiting in any way and include any substrate or structure that will eventually become a microelectronic device or microelectronic assembly. The microelectronic device can be patterned, blanketed, a control and/or a test device.

"Ion-implantation" is a process by which ions of a dopant material can be implanted into target material, usually a solid. The physical properties of an ion-implanted material are usually different from the physical properties of the target material prior to implantation. Ion-implantation is used in microelectronic device fabrication, for example, in the fabrication of integrated circuits and silicon semiconductor devices. The implanted ions may introduce or cause a chemical change in the target due to the ions being a different element than the target, and/or a structural change, in that the target may be modified, damaged or even destroyed by ion-implantation. By way of example only, elements that are typically used for implanted species in semiconductor fabrication include boron, boron difluoride, arsenic, indium, gallium, germanium, bismuth, xenon, phosphorus and antimony. Boron is a p-type dopant in silicon because it donates or causes a "hole" (i.e., electron vacancy) in the silicon. Arsenic is an n-type dopant in silicon because it donates or causes an extra electron in the silicon. Dopants, such as boron and arsenic, implanted in intrinsic silicon, may cause the intrinsic silicon to become conductive as a semiconductor. One or more dopant materials may be implanted into a target material. Ion-implantation is usually characterized by dose and energy. The dose is the number of ions that are implanted per area of target material. The energy is the energy of the ions being implanted. More advanced microelectronic device processing or fabrication technologies typically use higher dose and/or higher energy than older technologies. In high dose ion-implantation (HDII), the ion dose may be greater than about $5 \times 10^{14}$ ions/$cm^2$ and/or the average energy of the ions, before the ions impact the target or substrate, may be from about five thousand electron volts (KeV) to greater than 100 KeV.

"Resist" including photoresist (more generally, masking material) is a radiation sensitive material that is used to form a patterned coating on a surface, for example, the surface of a substrate or target. Resists are used in the fabrication of microelectronic devices, for example, integrated circuits and silicon semiconductor devices. One use of resists in the fabrication of semiconductor devices is as a mask for selective ion-implantation of dopants into a semiconductor substrate. A layer of resist is applied to the surface of the semiconductor substrate, or to the surface of a layer on or within the substrate, such as an insulator layer above a semiconductor layer. A portion of the resist is exposed to the radiation, such portion of the resist corresponding to either the area of the semiconductor to be implanted (positive resist) or to the area of the semiconductor not to be implanted (negative resist). The resist is then exposed to a developer which assists in removing a portion of the resist so that only the desired portion of the resist remains. Ion-implantation occurs after the resist is patterned by exposure to the radiation and developed by the developer. The remaining portion of the resist blocks the implanted ions from reaching the microelectronic device, or other material, below the resist. The ions blocked by the resist are implanted into the resist instead of the underlying substrate. The portions of the microelectronic device not covered by resist are ion-implanted. Because of the relatively high dose and/or high energy of the implanted ions blocked by the resist, the resist forms a crust or hard shell on the outer portions or outer sides of the resist where the ions impact and are absorbed. The resist hardening may result from, or be referred to as, carbonization, polymerizing or polymer cross-linking. The crust is known to be difficult to remove during a resist stripping process (e.g., the crust is insoluble in some known solvents used for stripping). The thickness of the resist crust is dependent upon the dosage of the implanted ions and the ion-implant energy. The resist material that is inside or beneath the crust, that is, the portion of the resist that is generally unaffected by the ions, is referred to as bulk resist or bulk resist material.

"High dose ion-implantation strip" (HDIS) is the process of stripping exposed resist that has received HDII. Some HDIS processes may include dry processes, such as plasma processes and vacuum processes. Characteristics of an HDIS process may include, for example, strip rate, amount of residue, and loss of the exposed and underlying layer, such as the substrate, silicon substrate or layers above silicon. Residues are sometimes found on the substrate surface after an HDIS. The residues may result from, for example, sputtering during HDII, incomplete removal of the outer layer of resist, and/or oxidation of implanted ions in the resist. Optimally, after stripping and, optionally, rinsing, the surface should be substantially residue free to ensure high yield and eliminate the need for additional residue removal processing.

As defined herein, the "surface" comprises at least silicon, a metal gate material, or both, for example, TiN comprised in a metal gate of an field-effect transistor (FET) or TiN comprised in a barrier between a semiconductor and a metal. Silicon is comprised in silicon-on-insulator (SOI) wafers that may be used, for example, as substrates or part of a substrate for electronic devices such as FETs and integrated circuits. "Silicon" may be defined to include, Si, polycrystalline Si, monocrystalline Si, and SiGe. Other forms of "silicon" may include silicon-containing materials such as silicon oxide, thermal oxide, SiOH and SiCOH.

As defined herein, "metal gate material" corresponds to materials having a Fermi level corresponding to the mid-gap of the semiconductor substrate such as Ti, Ta, W, Mo, Ru, Al, La, titanium nitride, tantalum nitride, tantalum carbide, titanium carbide, molybdenum nitride, tungsten nitride, ruthenium (IV) oxide, tantalum silicon nitride, titanium silicon nitride, tantalum carbon nitride, titanium carbon nitride, titanium aluminide, tantalum aluminide, titanium aluminum nitride, tantalum aluminum nitride, lanthanum oxide, or combinations thereof. It should be appreciated that the compounds disclosed as metal gate materials may have varying stoichiometries. Accordingly, titanium nitride will be represented as $TiN_x$ herein, tantalum nitride will be represented as $TaN_x$ herein, and so on.

As used herein, "about" is intended to correspond to ±5% of the stated value.

"Substantially devoid" is defined herein as less than 2 wt. %, preferably less than 1 wt. %, more preferably less than 0.5 wt. %, even more preferably less than 0.1 wt. %, and most preferably 0 wt. %.

As used herein, "to remove" means that material is dissolved or otherwise solubilized in the composition, preferably dissolved.

As used herein, "post-CMP residue" corresponds to particles from the polishing slurry, e.g., silica-containing particles, chemicals present in the slurry, reaction by-products of the polishing slurry, carbon-rich particles, polishing pad particles, brush deloading particles, equipment materials of construction particles, copper, copper oxides, copper-containing materials, aluminum, aluminum oxides, aluminum-containing materials, organic residues, and any other materials that are the by-products of the CMP process.

As used herein, "post-etch residue" corresponds to material remaining following gas-phase plasma etching processes, e.g., BEOL dual damascene processing. The post-etch residue may be organic, organometallic, organosilicic, or inorganic in nature, for example, silicon-containing material, carbon-based organic material, and etch gas residue such as oxygen and fluorine.

As defined herein, "post-ash residue," as used herein, corresponds to material remaining following oxidative or reductive plasma ashing to remove hardened photoresist and/or bottom anti-reflective coating (BARC) materials. The post-ash residue may be organic, organometallic, organosilicic, or inorganic in nature.

Compositions of the invention may be embodied in a wide variety of specific formulations, as hereinafter more fully described.

In all such compositions, wherein specific components of the composition are discussed in reference to weight percentage ranges including a zero lower limit, it will be understood that such components may be present or absent in various specific embodiments of the composition, and that in instances where such components are present, they may be present at concentrations as low as 0.001 weight percent, based on the total weight of the composition in which such components are employed.

The present invention relates to a composition and method of use wherein the composition can be used to safely remove hydrolyzed lanthanoid-containing solids and species, e.g., hydrolyzed cerium-containing solids and species, from a substrate having same thereon. As previously discussed, the reduction of lanthanoid-containing compounds and sometimes the dilution of the solution with water may result in precipitation of hydrolyzed solids such as $Ce(NO_3)_x(OH)_y$, where $x+y \leq 4$, especially at elevated temperatures typically used for HDIS. In addition, hydrolyzed lanthanoid-containing species, which are ionic or molecular in nature, may adsorb to films present on the surface being treated. Lanthanoid elements are generally known to be those elements with atomic numbers 57 through 71, i.e., lanthanum, cerium, praseodymium, neodymium, promethium, samarium, europium, gadolinium, terbium, dysprosium, holmium, erbium, thulium, ytterbium, and lutetium. Hereinafter, "lanthanoid-containing solids" and "lanthanoid-containing species" correspond to solids that comprise a lanthanoid element which precipitate on the surface as a result of reduction of the lanthanoid element, dilution of the composition comprising the lanthanoid element, or both, or otherwise adsorb to the surface.

In a first aspect, a method of removing lanthanoid-containing solids from the surface of a microelectronic device is described, said method comprising contacting the surface with a composition that substantially dissolves the lanthanoid-containing solids relative to the surface. Typically, the lanthanoid-containing solids will be present as particulate matter. Accordingly, "substantial dissolution" corresponds to the dissolution of at least 95% of the volume of the particle relative to the particle prior to contact with the composition, more preferably at least 98%, even more preferably at least 99%, and most preferably at least 99.9% of the volume of the particle relative to the particle prior to contact with the composition. Preferably, the selectivity of the composition for the lanthanoid-containing solids relative to the surface is at least about 100:1 lanthanoid-containing solid relative to surface, more preferably at least about 1000:1, even more preferably at least about 10000:1, and most preferably at least about 100000:1. Considered another way, the surface should not be substantially removed (i.e., dissolve, erode, etc.) by the composition while the lanthanoid-containing solids should be substantially removed. Preferably, the lanthanoid-containing solid comprises cerium.

In a second aspect, a method of removing lanthanoid-containing species from the surface of a microelectronic device is described, said method comprising contacting the surface with a composition that substantially removes the lanthanoid-containing species from the surface, wherein the lanthanoid-containing species are adsorbed at the surface prior to contact of the surface with the composition. Preferably, the surface is not substantially affected by the composition, meaning that the surface does not undergo substantial dissolution or erosion in the presence of the composition. As defined herein, "adsorption" corresponds to the adhesion of the lanthanoid-containing species at a surface and can be characterized as physisorption (physical adsorption characterized by weak van der Waals forces) or chemisorption (chemical adsorption driven by a chemical reaction occurring at a surface). Preferably, the lanthanoid-containing species comprises cerium.

In a third aspect, a method of removing lanthanoid-containing species and/or solids from microfabrication hardware is described, said method comprising contacting the surface of the hardware with a composition that substantially removes the lanthanoid-containing species and/or solids from the surface. Typically, the lanthanoid-containing solids will be present as particulate matter and the lanthanoid-containing species are adsorbed at the surface. Microfabrication hardware includes, but is not limited to, hardware used during photolithography that is exposed to compositions comprising lanthanoids. The material construction of the microfabrication hardware may be metal, plastic, glass, porcelain, or a mineral. Preferably, the lanthanoid comprises cerium and the lanthanoid-containing solid and/or species comprise cerium.

The methods of the first, second and third aspects are carried out at temperature in a range from about room temperature to about 100° C., preferably about room temperature to about 80° C., and most preferably about room temperature to about 60° C. It should be appreciated by the skilled artisan that the time of removal varies depending on whether the removal is performed in a single wafer tool or a multiple wafer tool or lanthanoid-containing species and/or solid is removed from hardware. For a single wafer tool, time is preferably in a range from about 10 sec to about 10 minutes, preferably about 20 sec to about 5 minutes, and for a multiple wafer tool or hardware, time is preferably in a range from about 1 minute to about 1000 minutes. Such contacting times and temperatures are illustrative, and any other suitable time and temperature conditions may be employed that are efficacious to remove cerium-containing solids and/or species from a surface.

In removal application from a surface of a microelectronic device, the composition is applied in any suitable manner to the device, e.g., by spraying the composition on the surface of the device, by dipping the device in a static or dynamic volume of the composition, by contacting the device with another material, e.g., a pad, or fibrous sorbent applicator element, that has the composition absorbed thereon, or by any other suitable means, manner or technique by which the composition is brought into contact with the surface having the cerium-containing solids and/or species thereon. Further, batch or single wafer processing is contemplated herein. In removal application from hardware, the composition is applied in any suitable manner to the hardware, e.g., by spraying the composition on the surface of the hardware, by dipping the hardware in a static or dynamic volume of the composition, by contacting the hardware with another material, e.g., a pad, or fibrous sorbent applicator element, that has the composition absorbed thereon, or by any other suitable means, manner or technique by which the composition is brought into contact with the hardware having the cerium-containing solids and/or species thereon.

Following the achievement of the desired removal action, the composition is readily removed from the surface of the device or the hardware to which it has previously been applied, e.g., by rinse, wash, or other removal step(s), as may be desired and efficacious. For example, the device or hardware may be rinsed with a rinse solution including deionized water and/or dried (e.g., spin-dry, N₂, solvents (such as IPA) vapor-dry etc.).

In a fourth aspect, a composition to remove lanthanoid-containing solids and/or species is described, said composition including at least one acid and at least one reducing agent. In one embodiment, the composition comprises, consists of or consists essentially of at least one strong acid, at least one reducing agent, optionally at least one salt of the at least one strong acid, and water, with the proviso that the composition is substantially devoid of fluoride ions and when the at least one strong acid is nitric acid and the at least one reducing agent is hydrogen peroxide, the composition is substantially devoid of (i) boric acid and (ii) an organic acid having an active carboxylic acid group such as tartaric acid, citric acid, lactic acid, gluconic acid and edetic acid. In another embodiment, the composition comprises, consists of or consists essentially of at least one weak acid, at least one reducing agent, and water, with the proviso that the composition is substantially devoid of fluoride ions. Preferably, the composition does not substantially remove metal gate material present on the substrate. The water is preferably deionized. Preferably, the composition is used in the methods of the first through third aspects described herein.

The pH of the composition of the fourth aspect is in a range from about 0 to about 4, preferably about 1 to about 3.5. When titanium nitride layers are present, preferably the pH of the composition is greater than or equal to 2 and less than 4.

The at least one strong acid is selected from the group consisting of nitric acid, sulfuric acid, perchloric acid, hydrochloric acid, hydrobromic acid, hydroiodic acid, methanesulfonic acid, and combinations thereof. Preferably, the at least one strong acid comprises sulfuric acid, nitric acid, or a combination of nitric and sulfuric acid, even more preferably sulfuric acid. The amount of the at least one strong acid is preferably in a range from about 0.1 wt % to about 15 wt %, preferably about 0.1 wt % to about 5 wt %, and most preferably about 0.5 wt % to about 2.5 wt %, based on the total weight of the composition.

The at least one reducing agent includes, but is not limited to, hydrogen peroxide, ascorbic acid, borane complexes such as borane-pyridine or borane-morpholine, hydroxylamine sulfate, hydroxylamine hydrochloride, ammonium nitrite, ammonium sulfite, ammonium hydrogen sulfite, hydrazine sulfate, hydrazine hydrochloride, ammonium hydrogen sulfide, diethyl malonate, hydroquinone, ammonium metabisulfite, polyphenon 60, glucose, ammonium citrate, hydrogen, formic acid, oxalic acid, acetaldehyde, hydrogen iodide, ammonium phosphite, ammonium hydrogen phosphite, hypophosphorous acid, and combinations thereof. The above mentioned "ascorbic acid" refers to not only ascorbic acid itself (reduced-form) but also dehydroascorbic acid (oxidized-form), xyloascorbic acid, araboascorbic acid, optical isomers of both the L-isomer and D-isomer, and esters of ascorbic acid. Preferably, the at least one reducing agent comprises ascorbic acid or hydrogen peroxide, preferably ascorbic acid. The amount of the at least one reducing agent is preferably in a range from about 0.1 wt % to about 10 wt %, preferably about 0.1 wt % to about 5 wt %, and most preferably about 0.1 wt % to about 2 wt %, based on the total weight of the composition.

When present, the salt of the at least one strong acid corresponds to a sodium, potassium, tetramethylammonium, or preferably ammonium salt of the conjugate base of the at least one strong acid. For example, if the strong acid comprises sulfuric acid, the salt of the at least one strong acid can be sodium sulfate, potassium sulfate, tetramethylammonium sulfate, ammonium sulfate, or the like. When present, the amount of salt of the at least one strong acid is preferably in a range from about 0.1 to about 10 wt %, preferably about 0.5 to about 5 wt %, based on the total weight of the composition.

Accordingly, the components of the composition comprising, consisting of or consisting essentially of at least one strong acid, at least one reducing agent, optionally at least one salt of the at least one strong acid, and water, with the proviso that the composition is substantially devoid of fluoride ions and when the at least one strong acid is nitric acid and the at least one reducing agent is hydrogen peroxide, the composition is substantially devoid of (i) boric acid and (ii) an organic acid having an active carboxylic acid group such as tartaric acid, citric acid, lactic acid, gluconic acid and edetic acid, are present in the following amounts:

| component | preferably | more preferably | most preferably | alternative |
| --- | --- | --- | --- | --- |
| strong acid(s) | about 0.1 to about 15 wt % | about 0.1 to about 5 wt % | about 0.5 to about 2.5 wt % | about 0.5 to about 2.5 wt % |
| reducing agent(s) | about 0.1 to about 10 wt % | about 0.1 to about 5 wt % | about 0.1 to about 2 wt % | about 0.1 to about 2 wt % |
| salt of strong acid | 0 to about 10 wt % | 0 to about 10 wt % | 0 to about 10 wt % | 0.5 to about 5 wt % |
| water | about 65 to about 99.8 wt % | about 80 to about 99.8 wt % | about 90.5 to about 98.9 wt % | about 85.5 to about 99.4 wt % |

For the purposes of the present disclosure, a "weak acid" preferably has a pKa in a range from about 1.5 to about 4. Weak acids include, but are not limited to, nitrous acid, phosphorous acid, hydrogen bisulfate, hydrogen selenite, phosphoric acid, cyanic acid, formic acid, glyceric acid, glycolic acid, glyoxylic acid, lactic acid, pyruvic acid, mandelic acid, succinic acid, malonic acid, and combinations thereof. Preferably, the at least one weak acid comprises formic acid. The amount of the at least one weak acid is preferably in a range from about 0.1 wt % to about 15 wt %, preferably about 0.1 wt % to about 5 wt %, and most preferably about 1 wt % to about 5 wt %, based on the total weight of the composition.

Accordingly, the components of the composition comprising, consisting of or consisting essentially of at least one weak acid, at least one reducing agent, and water, with the proviso that the composition is substantially devoid of fluoride ions, are present in the following amounts:

| component | preferably | more preferably | most preferably |
|---|---|---|---|
| weak acid(s) | about 0.1 to about 15 wt % | about 0.1 to about 5 wt % | about 1 to about 5 wt % |
| reducing agent(s) | about 0.1 to about 10 wt % | about 0.1 to about 5 wt % | about 0.1 to about 2 wt % |
| water | about 75 to about 99.8 wt % | about 90 to about 99.8 wt % | about 93 to about 98.9 wt % |

In a preferred embodiment, the composition of the fourth aspect comprises, consists of, or consists essentially of nitric acid, ascorbic acid, and water. In another embodiment, the composition of the fourth aspect comprises, consists of, or consists essentially of sulfuric acid, ascorbic acid, and water. In still another embodiment, the composition of the fourth aspect comprises, consists of, or consists essentially of hydrochloric acid, ascorbic acid, and water. In yet another embodiment, the composition of the fourth aspect comprises, consists of, or consists essentially of formic acid, ascorbic acid, and water. Still another embodiment of the fourth aspect is a composition comprising, consisting of, or consisting essentially of malonic acid, ascorbic acid, and water. In another embodiment, the composition of the fourth aspect comprises, consists of, or consists essentially of sulfuric acid, ammonium sulfate, ascorbic acid, and water. In each embodiment, the composition is substantially devoid of fluoride ions.

The composition of the fourth aspect can further comprise at least one reduced lanthanoid species, e.g., cerium (III) species, solubilized therein. Accordingly, in another embodiment, the composition comprises, consists of or consists essentially of at least one strong acid, at least one reducing agent, at least one reduced lanthanoid species, optionally at least one salt of the at least one strong acid, and water, with the proviso that the composition is substantially devoid of fluoride ions and when the at least one strong acid is nitric acid and the at least one reducing agent is hydrogen peroxide, the composition is substantially devoid of (i) boric acid and (ii) an organic acid having an active carboxylic acid group such as tartaric acid, citric acid, lactic acid, gluconic acid and edetic acid. In yet another embodiment, the composition comprises, consists of or consists essentially of at least one weak acid, at least one reducing agent, at least one reduced lanthanoid species, and water, with the proviso that the composition is substantially devoid of fluoride ions.

It will be appreciated that it is common practice to make concentrated forms of the compositions to be diluted prior to use. For example, the composition may be manufactured in a more concentrated form, including at least one strong acid, at least one reducing agent, optionally at least one salt of the at least one strong acid, and water, with the proviso that the composition is substantially devoid of fluoride ions and when the at least one strong acid is nitric acid and the at least one reducing agent is hydrogen peroxide, the composition is substantially devoid of (i) boric acid and (ii) an organic acid having an active carboxylic acid group such as tartaric acid, citric acid, lactic acid, gluconic acid and edetic acid, and thereafter diluted with water at the manufacturer, before use, and/or during use at the fab. In another embodiment, the composition may comprise, consist of or consist essentially of at least one weak acid, at least one reducing agent, at least one reduced lanthanoid species, and water, with the proviso that the composition is substantially devoid of fluoride ions, and thereafter diluted with water at the manufacturer, before use, and/or during use at the fab. Dilution ratios may be in a range from about 0.1 part diluent:1 part composition concentrate to about 100 parts diluent:1 part composition concentrate.

The compositions of the invention are easily formulated by simple addition of the respective ingredients and mixing to homogeneous condition. Furthermore, the compositions may be readily formulated as single-package formulations or multi-part formulations that are mixed at or before the point of use, preferably multi-part formulations. The individual parts of the multi-part formulation may be mixed at the tool or in a mixing region/area such as an inline mixer or in a storage tank upstream of the tool. It is contemplated that the various parts of the multi-part formulation may contain any combination of ingredients/constituents that when mixed together form the desired composition. The concentrations of the respective ingredients may be widely varied in specific multiples of the composition, i.e., more dilute or more concentrated, and it will be appreciated that the compositions described herein can variously and alternatively comprise, consist or consist essentially of any combination of ingredients consistent with the disclosure herein.

Accordingly, a fifth aspect relates to a kit including, in one or more containers, one or more components adapted to form the compositions described herein. Preferably, the kit includes, in one or more containers, at least one strong acid, at least one reducing agent, optionally at least one salt of the at least one strong acid, and optionally water, for combining with water at the fab or the point of use. Optionally, the containers of the kit may include at least one weak acid, at least one reducing agent, and optionally water, for combining with water and/or oxidizing agent(s) at the fab or the point of use. The containers of the kit must be suitable for storing and shipping said removal compositions, for example, NOWPak® containers (Advanced Technology Materials, Inc., Danbury, Conn., USA). The one or more containers which contain the components of the composition preferably include means for bringing the components in said one or more containers in fluid communication for blending and dispense. For example, referring to the NOWPak® containers, gas pressure may be applied to the outside of a liner in said one or more containers to cause at least a portion of the contents of the liner to be discharged and hence enable fluid communication for blending and dispense. Alternatively, gas pressure may be applied to the head space of a conventional pressurizable container or a pump may be used to enable fluid communication. In addition, the system preferably includes a dispensing port for dispensing the blended removal composition to a process tool.

Substantially chemically inert, impurity-free, flexible and resilient polymeric film materials, such as high density polyethylene, are preferably used to fabricate the liners for said one or more containers. Desirable liner materials are processed without requiring co-extrusion or barrier layers, and without any pigments, UV inhibitors, or processing agents that may adversely affect the purity requirements for components to be disposed in the liner. A listing of desirable liner materials include films comprising virgin (additivefree) polyethylene, virgin polytetrafluoroethylene (PTFE), polypropylene, polyurethane, polyvinylidene chloride, polyvinylchloride, polyacetal, polystyrene, polyacrylonitrile, polybutylene, and so on. Preferred thicknesses of such liner materials are in a range from about 5 mils (0.005 inch) to about 30 mils (0.030 inch), as for example a thickness of 20 mils (0.020 inch).

Regarding the containers for the kits, the disclosures of the following patents and patent applications are hereby incorporated herein by reference in their respective entireties: U.S. Pat. No. 7,188,644 entitled "APPARATUS AND METHOD FOR MINIMIZING THE GENERATION OF PARTICLES IN ULTRAPURE LIQUIDS;" U.S. Pat. No. 6,698,619 entitled "RETURNABLE AND REUSABLE, BAG-IN-DRUM FLUID STORAGE AND DISPENSING CONTAINER SYSTEM;" and PCT/US08/63276 entitled "SYSTEMS AND METHODS FOR MATERIAL BLENDING AND DISTRIBUTION" filed on May 9, 2008 in the name of Advanced Technology Materials, Inc.

A sixth aspect of the invention relates to the removal of post-etch residue, post-ash residue, post-chemical mechanical polishing residue, and other contaminants and/or byproducts of the microelectronic device manufacturing process, said method comprising contacting a surface of a microelectronic device having said residue, contaminants and/or by-products thereon with a composition of the fourth aspect to substantially remove said residue, contaminants and/or by-products from the surface.

Another aspect relates to the improved microelectronic devices made according to the methods of the invention and to products containing such microelectronic devices.

A still further aspect relates to methods of manufacturing an article comprising a microelectronic device, said method comprising contacting a surface of the microelectronic device with a composition for sufficient time to substantially dissolve lanthanoid-containing solids and/or species from the surface, and incorporating said microelectronic device into said article. Preferably, the lanthanoid comprises cerium.

Yet another aspect relates to an article of manufacture comprising a composition and a surface comprising lanthanoid-containing solids and/or species, wherein the composition comprises, consists of or consists essentially of at least one strong acid, at least one reducing agent, optionally at least one salt of the at least one strong acid, and water, with the proviso that the composition is substantially devoid of fluoride ions and when the at least one strong acid is nitric acid and the at least one reducing agent is hydrogen peroxide, the composition is substantially devoid of (i) boric acid and (ii) an organic acid having an active carboxylic acid group such as tartaric acid, citric acid, lactic acid, gluconic acid and edetic acid. Alternatively, the composition comprises, consists of or consists essentially of at least one weak acid, at least one reducing agent, and water, with the proviso that the composition is substantially devoid of fluoride ions.

Another aspect relates to a method for removing photoresist from a surface, said method comprising contacting the photoresist with a solution comprising cerium to substantially remove the photoresist, and contacting the surface with a composition that substantially removes the lanthanoid-containing species present on the surface. Prior to contacting the photoresist with the solution, it is assumed that the photoresist has been ion-implanted by greater than approximately $5 \times 10^{14}$ ions per square centimeter, and/or ions having an average energy, before the ions impact the photoresist, greater than approximately five thousand electron volts (5 KeV). Preferably, the surface comprises TiN.

Preferably, the solution used to remove the resist or photoresist comprises cerium ammonium nitrate. Preferably, the composition that substantially removes the lanthanoid-containing species is one of the compositions of the fourth aspect described herein.

In another aspect, a method for removing a masking material is described, the method comprising: contacting the masking material with a solution comprising cerium and contacting the surface with a composition that substantially removes the lanthanoid-containing species present on the surface, wherein the masking material is comprised within a layer formed on at least a first portion of a surface, and wherein the masking material blocks at least a first portion of dopant material from contacting the at least a first portion of the surface, and wherein the first portion of the dopant material comprises ions implanted into the masking material. Ions implanted into the masking material can comprise at least one of: boron; boron trifluoride; indium; gallium; thallium; germanium; bismuth; arsenic; phosphorus; xenon and antimony. Preferably, the solution used to remove the resist or photoresist comprises cerium ammonium nitrate. Preferably, the composition that substantially removes the lanthanoid-containing species is one of the compositions of the fourth aspect described herein.

Still another aspect relates to the removal of manganese oxide particles from the surface of microfabrication hardware, said method comprising contacting the surface of the hardware with a composition that substantially removes the manganese oxide particles from the surface. Manganese oxide particles are often the byproduct of a composition that includes permanganate, whether present as a permanganate salt or generated in situ, wherein the manganese oxide particles deposit on the surface of the microfabrication hardware as well as on wafers. It was surprisingly discovered that the compositions described herein, are effective at dissolving these manganese-containing precipitates under the process conditions described herein to remove lanthanum-containing species.

The features and advantages of the invention are more fully illustrated by the following non-limiting examples, wherein all parts and percentages are by weight, unless otherwise expressly stated.

Example 1

To test the capability of various solutions to dissolve Ce(IV)-containing precipitates, the precipitates were generated by heating a 20% cerium ammonium nitrate (CAN) solution in deionized water at 70° C. for 20 hours. A substantial amount of yellow precipitate was formed and settled at the bottom of the bottle. The solution was decanted, leaving behind a slurry of precipitate in residual CAN solution. The dissolution of 0.05-0.1 ml of the slurry was then tested at room temperature in test tubes, in the presence of 3-6 ml water, some acid, and some reducing agent. The mixture was shaken vigorously in the capped test tube for 0.5-2 minutes and then periodically as needed. The dissolution was considered successful if the solution was colorless and clear within 1 minute; however, it should be understood that much longer process times and/or temperatures higher than ambient may be acceptable.

Solution 1: 0.2 g ascorbic acid, 4 g dilute $HNO_3$ (1 part by weight of conc. $HNO_3$:3 parts by weight water, hereinafter the "1:3 $HNO_3$ solution"), 0.1 mL slurry. The original dark color and turbidity disappears in less than 1 min. Two additional 0.1 mL slurry additions were quickly dissolved as well.

Solution 2: 0.2 g ascorbic acid, 4 g water, 0.1 mL slurry. No obvious effect. After adding 1 g of 1:3 $HNO_3$ and shaking, the turbidity and color quickly disappeared.

Solution 3: 0.1 g ascorbic acid, 4 g water, 1 g 1:3 $HNO_3$, 0.1 mL slurry. All turbidity and color disappeared within 80 sec.

Solution 4: 0.1 g ascorbic acid, 3.6 g water, 0.5 g 4 M $H_2SO_4$, 0.1 mL slurry. All turbidity and color disappeared within 20 sec.

Solution 5: 0.11 g ascorbic acid, 4.9 g water, 0.1 g 95% $H_2SO_4$, 0.1 mL slurry. All turbidity and color disappeared within 40 sec.

Solution 6: 0.05 g ascorbic acid, 4.9 g water, 0.1 g 95 wt % $H_2SO_4$, 0.05 mL slurry. All turbidity and color disappeared within 30 sec. When another 0.05 mL slurry was added, all turbidity and color disappeared within 40 sec.

Solution 7: 0.05 g ascorbic acid, 2 g 1 M HCl, 3 g water, 0.05 mL slurry. The dark brown color faded slowly and was clear after 4 min.

Solution 8: 0.060 g ascorbic acid, ~5 g water, 0.110 g 95% $H_2SO_4$, 0.189 g $(NH_4)_2SO_4$, water to obtain a total of 6 g, mix, and then 0.1 mL slurry. No dark color observed, but turbidity disappears after about 1 minute. Note that this mixture is part $NH_4HSO_4$, part $(NH_4)_2SO_4$.

Solution 9: 0.055 g ascorbic acid, 5.9 g water, 0.24 g 95% formic acid, 0.06 mL slurry. All turbidity and color disappeared within 30 sec of shaking.

Solution 10: 5.9 g water, 0.24 g 95% formic acid, 0.06 mL slurry. No significant dissolution in ~3 minutes, but following the addition of ~50 mg ascorbic acid, rapid dissolution occurred (~30 sec).

Solution 11: 0.05 g ascorbic acid, 0.25 g malonic acid, 4.7 g water, 0.05 mL slurry. The solution initially was a light brown color, which cleared after about 7 min.

Although not wishing to be bound by theory, these examples suggest that the presence of an acid stronger than ascorbic acid is useful for the speedy dissolution of Ce(IV)-containing particles. The solutions, which were devoid of fluoride, were effective at dissolving the Ce(IV)-containing particles even at room temperature without damaging the surface.

Although the invention has been variously disclosed herein with reference to illustrative embodiments and features, it will be appreciated that the embodiments and features described hereinabove are not intended to limit the invention, and that other variations, modifications and other embodiments will suggest themselves to those of ordinary skill in the art, based on the disclosure herein. The invention therefore is to be broadly construed, as encompassing all such variations, modifications and alternative embodiments within the spirit and scope of the claims hereafter set forth.

What is claimed is:

1. An aqueous composition comprising:
    an acid having a pKa of less than 4, wherein the acid is a strong acid having a pKa of less than 1.5 selected from the group consisting of nitric acid, sulfuric acid, perchloric acid, hydrochloric acid, hydrobromic acid, hydroiodic acid, methanesulfonic acid, and combinations thereof, and is present in an amount ranging from 0.1 to 15 wt. % based on the total weight of the composition;
    a reducing agent, wherein the reducing agent is present in an amount ranging from 0.1 to 10 wt. % based on the total weight of the composition;
    a salt of the strong acid; and
    at least 65 wt. % water, the composition substantially devoid of fluoride ions, wherein when in contact with a surface of a microelectronic device including metal gate material and having lanthanoid-containing solids present thereon, the composition dissolves at least some of the lanthanoid-containing solids without substantially removing metal gate material present on the substrate.

2. The aqueous composition of claim 1, wherein the strong acid is nitric acid, sulfuric acid, or a combination of nitric acid and sulfuric acid.

3. The aqueous composition of claim 1, wherein the acid is present in an amount ranging from 0.1 to 5 wt. % based on the total weight of the composition.

4. An aqueous composition comprising:
    an acid having a pKa of less than 4, wherein the acid is present in an amount ranging from 0.1 to 15 wt. % based on the total weight of the composition;
    a reducing agent, wherein the reducing agent is present in an amount ranging from 0.1 to 10 wt. % based on the total weight of the composition; and
    at least 65 wt. % water,
    wherein the acid is a weak acid having a pKa in a range from about 1.5 to about 4, wherein the weak acid is selected from the group consisting of nitrous acid, phosphorous acid, cyanic acid, formic acid, glyceric acid, glycolic acid, lactic acid, pyruvic acid, mandelic acid, succinic acid, malonic acid, and combinations thereof, and
    wherein when in contact with a surface of a microelectronic device having lanthanoid-containing solids present thereon, the composition dissolves at least some of the lanthanoid-containing solids.

5. The aqueous composition of claim 4, wherein the weak acid is formic acid.

6. The aqueous composition of claim 1, wherein the reducing agent is present in an amount ranging from 0.1 to 5 wt. % based on the total weight of the composition.

7. The aqueous composition of claim 1, wherein the reducing agent is selected from the group consisting of ascorbic acid, borane-pyridine, borane-morpholine, hydroxylamine sulfate, hydroxylamine hydrochloride, ammonium nitrite, ammonium sulfite, ammonium hydrogen sulfite, hydrazine sulfate, hydrazine hydrochloride, ammonium hydrogen sulfide, diethyl malonate, hydroquinone, ammonium metabisulfite, polyphenon 60, glucose, ammonium citrate, hydrogen, formic acid, oxalic acid, acetaldehyde, hydrogen iodide, ammonium phosphite, ammonium hydrogen phosphite, hypophosphorous acid, and combinations thereof.

8. The aqueous composition of claim 1, wherein the reducing agent is ascorbic acid.

9. The aqueous composition of claim 1, wherein the reducing agent is polyphenon 60.

10. The aqueous composition of claim 1, wherein the lanthanoid-containing solids comprises cerium-containing solids, and wherein when in contact with the surface of a microelectronic device having cerium-containing solids present thereon, the composition dissolves at least some of the cerium-containing solids.

11. The aqueous composition of claim 4, wherein the reducing agent is present in an amount ranging from 0.1 to 5 wt. % based on the total weight of the composition.

12. The aqueous composition of claim 4, wherein the reducing agent is selected from the group consisting of ascorbic acid, borane-pyridine, borane-morpholine, hydroxylamine sulfate, hydroxylamine hydrochloride, ammonium nitrite, ammonium sulfite, ammonium hydrogen sulfite, hydrazine sulfate, hydrazine hydrochloride, ammonium hydrogen sulfide, diethyl malonate, hydroquinone, ammonium metabisulfite, polyphenon 60, glucose, ammonium citrate, hydrogen, formic acid, oxalic acid, acetaldehyde, hydrogen iodide, ammonium phosphite, ammonium hydrogen phosphite, hypophosphorous acid, and combinations thereof.

13. The aqueous composition of claim 4, wherein the reducing agent is ascorbic acid.

14. The aqueous composition of claim 4, wherein the reducing agent is polyphenon 60.

15. The aqueous composition of claim 4, wherein the lanthanoid-containing solids comprises cerium-containing solids, and wherein when in contact with the surface of a microelectronic device having cerium-containing solids present thereon, the composition dissolves at least some of the cerium-containing solids.

* * * * *